United States Patent
Matsuo et al.

(10) Patent No.: US 7,812,391 B2
(45) Date of Patent: Oct. 12, 2010

(54) NONVOLATILE SEMICONDUCTOR MEMORY DEVICE AND METHOD OF FABRICATING THE SAME

(75) Inventors: Kazuhiro Matsuo, Mie (JP); Masayuki Tanaka, Kanagawa (JP); Atsuhiro Suzuki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 93 days.

(21) Appl. No.: 12/354,200

(22) Filed: Jan. 15, 2009

(65) Prior Publication Data
US 2009/0189213 A1 Jul. 30, 2009

(30) Foreign Application Priority Data
Jan. 18, 2008 (JP) .............................. 2008-009321

(51) Int. Cl.
H01L 21/76 (2006.01)
(52) U.S. Cl. ...................... 257/324; 257/508; 257/510; 257/E29.02; 257/E21.546; 257/E21.661; 438/296; 438/435
(58) Field of Classification Search ................ 257/324, 257/325, 508–510, E29.02, E21.56, E21.551, 257/E21.662; 438/294, 296, 424, 435, FOR. 212, 438/FOR. 221, FOR. 227
See application file for complete search history.

(56) References Cited

U.S. PATENT DOCUMENTS

2002/0197823 A1* 12/2002 Yoo et al. ................... 438/424
2006/0183296 A1 8/2006 Yoo et al.
2006/0214258 A1 9/2006 Kiyotoshi

FOREIGN PATENT DOCUMENTS

JP 2006-269789 10/2006

* cited by examiner

Primary Examiner—Matthew Smith
Assistant Examiner—Quovaunda Jefferson
(74) Attorney, Agent, or Firm—Oblon, Spivak, McClelland, Maier & Neustadt, L.L.P.

(57) ABSTRACT

A nonvolatile semiconductor memory device includes a semiconductor substrate having a plurality of active regions separately formed by a plurality of trenches formed in a surface of the substrate at predetermined intervals, a first gate insulating film formed on an upper surface of the substrate corresponding to each active region, a gate electrode of a memory cell transistor formed by depositing an electrical charge storage layer formed on an upper surface of the gate insulating film, a second gate insulating film and a control gate insulating film sequentially, an element isolation insulating film buried in each trench and formed from a coating type oxide film, and an insulating film formed inside each trench on a boundary between the semiconductor substrate and the element isolation insulating film, the insulating film containing nontransition metal atoms and having a film thickness not more than 5 Å.

11 Claims, 15 Drawing Sheets

LEAK CURRENT Jg
(A/cm²)
(LOGARITHMIC SCALE)

ELECTRIC FIELD INTENSITY Eg (MV/cm)
(LINEAR SCALE)
LEAK CURRENT CHARACTERISTIC WHEN
Al₂O₃ FILM HAS BEEN INSERTED
INTO MIS CAPACITOR

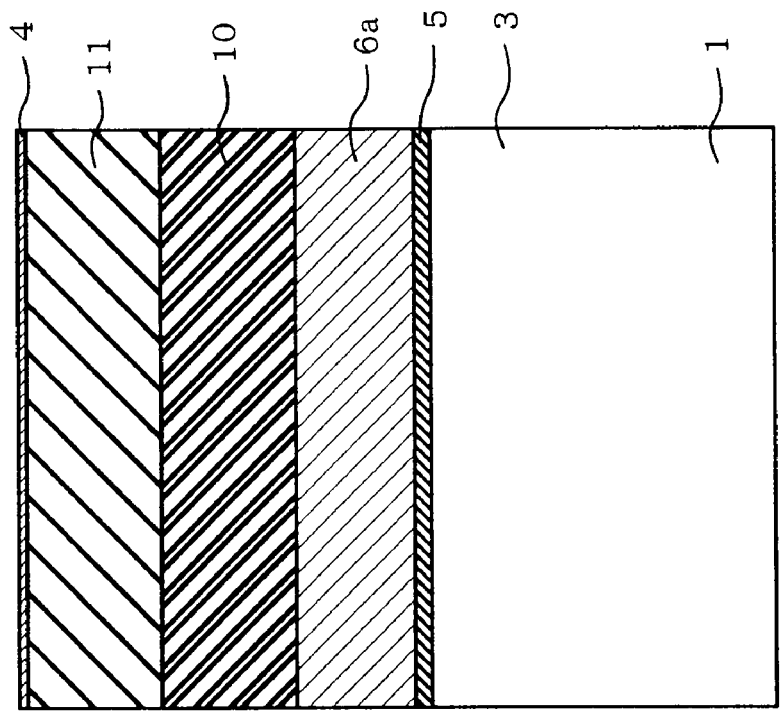
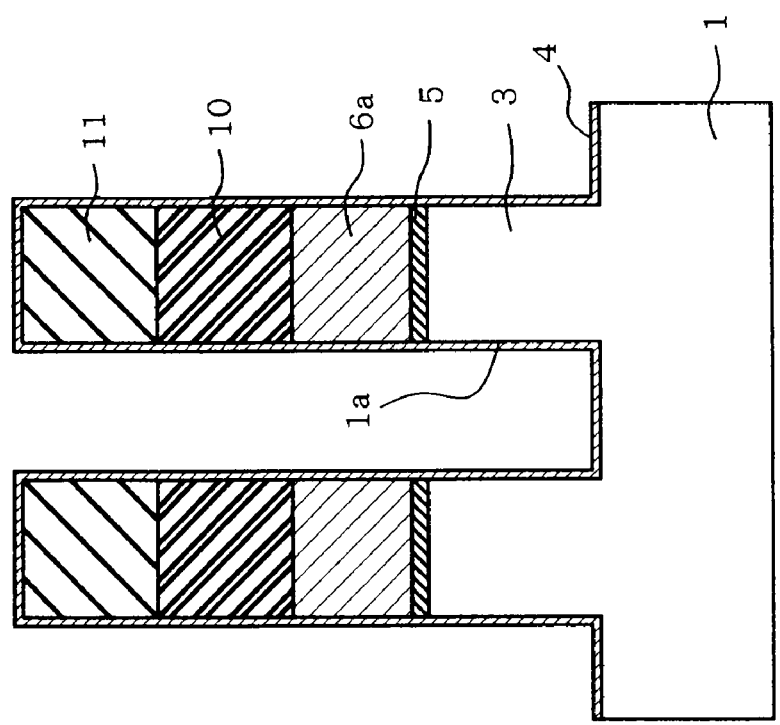

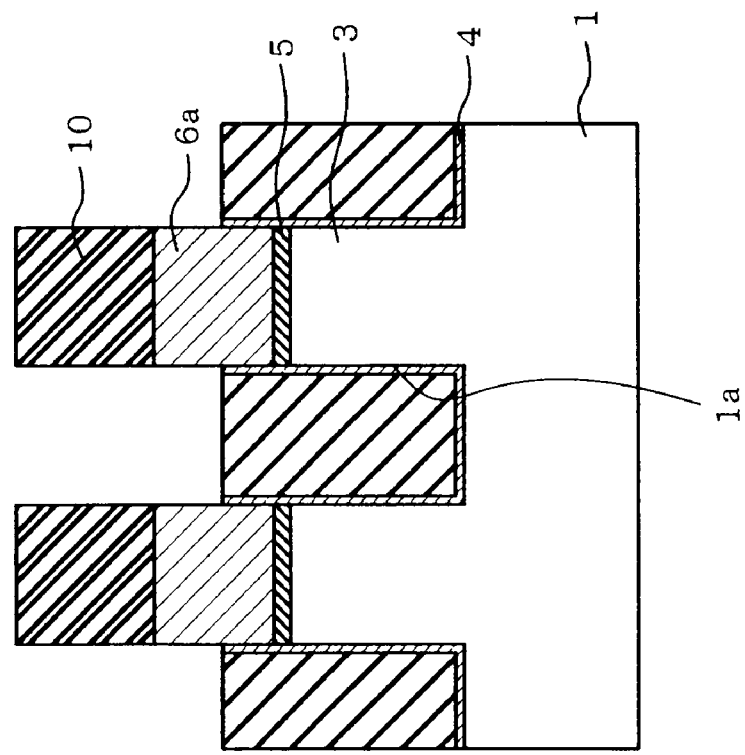
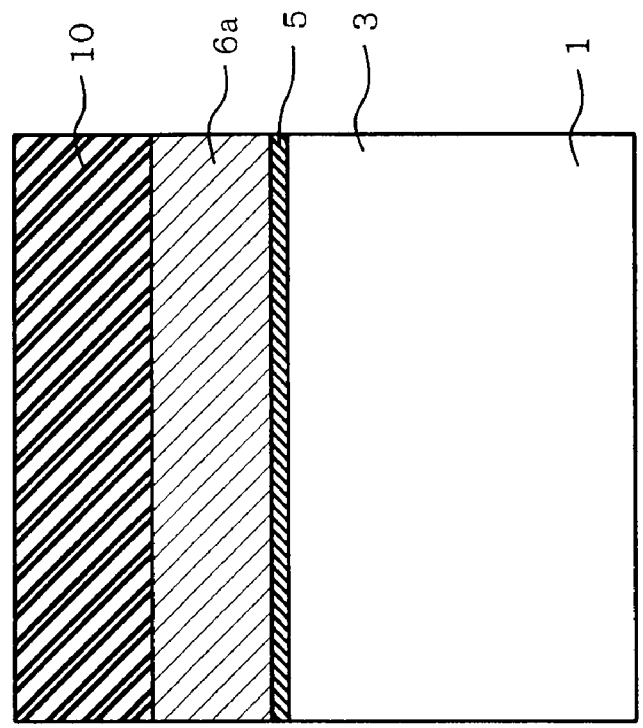
FIG. 8A
FIG. 8B

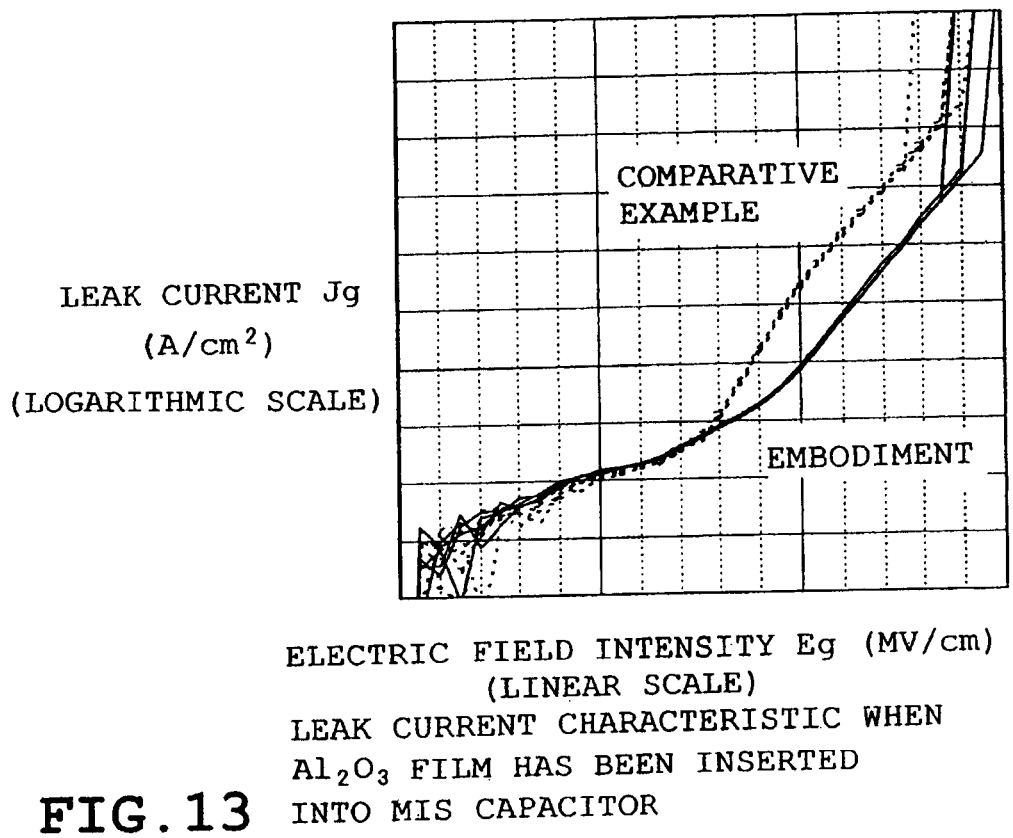
FIG. 13 LEAK CURRENT CHARACTERISTIC WHEN $Al_2O_3$ FILM HAS BEEN INSERTED INTO MIS CAPACITOR
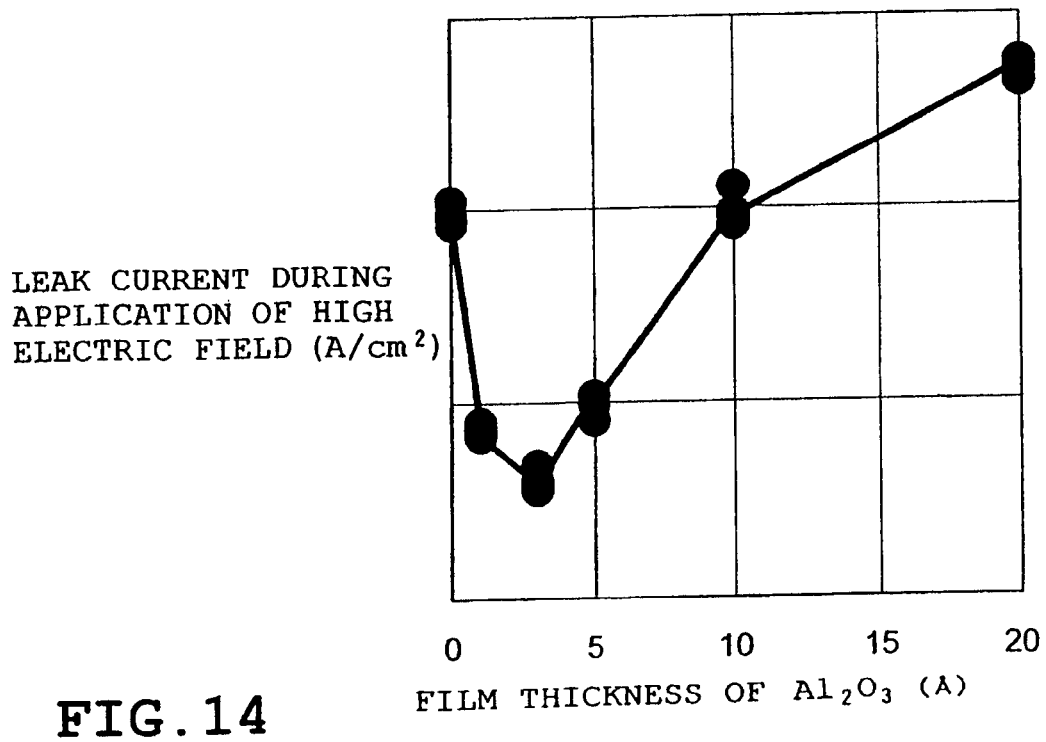
FIG. 14

NONVOLATILE SEMICONDUCTOR MEMORY DEVICE AND METHOD OF FABRICATING THE SAME

CROSS-REFERENCE TO RELATED APPLICATIONS

This application is based on and claims the benefit of priority from the prior Japanese Patent Application No. 2008-9321, filed on Jan. 18, 2008, the entire contents of which are incorporated herein by reference.

BACKGROUND OF THE INVENTION

1. Field of the Invention

The present invention relates to a nonvolatile semiconductor memory device having a number of memory cell transistors each of which is provided with a floating gate electrode and a control gate electrode, and a method of fabricating the same.

2. Description of the Related Art

Nonvolatile semiconductor memory devices such as NAND flash memories comprise a number of memory cell transistors each of which is provided with a floating gate electrode as a gate electrode. The floating gate electrode is disposed between two insulating films which are further disposed between a semiconductor substrate and a control gate. The floating gate electrode stores electrical charge so that the memory device can maintain a memorizable state even after power-off thereof.

A distance between cells adjacent to each other has recently been reduced for improvement in a degree of integration in the above-described NAND flash memories. On the other hand, an element isolation region is formed between the memory cell transistors adjacent to each other. With refinement in the design rules, a width of the region where the element isolation region is to be formed needs to be reduced. Accordingly, it has become difficult to bury an element isolation insulating film such as silicon oxide film in a trench having a high aspect ratio and a small opening width. In order to overcome the difficulty, Japanese patent application publication, JP-A-2006-269789, discloses a coating-type oxide film used as an element isolation insulating film for improvement in a trench-filling characteristic of an insulating film.

A coating-type oxide film used as an element isolation insulating film, such as polysilazane, contains impurities resulting from a solvent, such as carbon (C) or nitride (N). When the impurities remain in the film as fixed charge, off-leak current of a transistor is increased. In JP-A-2006-269789, a hafnia film or alumina film each of which has a film thickness of 5 nm is formed as a liner film for the polysilazane film, thereby cancelling a fixed charge to reduce off-leak current.

However, a new problem arises which cannot be overcome by JP-A-2006-269789. With reduction in the design rules, parasitic capacity is increased since gate electrodes of the memory cell transistors adjacent to each other are located close to each other. The adjacent memory cell transistors interfere with each other during operation due to the parasitic capacity. As a result, the memory cell transistors malfunction or a writing/erasing speed is reduced.

In order that interference between the adjacent memory cell transistors may be reduced, the parasitic capacity between the adjacent memory cell transistors needs to be reduced. For example, it is effective to reduce an area of an opposed portion of a gate electrode which is one of elements of the parasitic capacity. For this purpose, it has been suggested to reduce the height of the floating gate electrode. However, even the cell structure including the floating gate electrode with a reduced height necessitates the same coupling ratio as in the conventional configuration or a ratio of the capacity of tunnel insulating film (the first gate insulating film) to the capacity of interelectrode insulating film (the second gate insulating film), in order that a desired element characteristic may be ensured.

Thus, the reduction in the interelectrode insulation area is accompanied by the reduction in the height of the floating gate electrode as described above. The sidewalls of the floating gate electrode need to be utilized to the utmost extent in order that the reduction in the interelectrode insulation area may be compensated for. Accordingly, the location of the upper surface of the element isolation insulating film needs to be lowered as compared with the conventional configuration. However, a distance between the semiconductor substrate and the control gate electrode is reduced when the location of the upper surface of the element isolation insulating film is lowered. Accordingly, when high voltage is applied during writing, the electrical field intensity is rendered larger between the semiconductor substrate and the control gate electrode as compared with the conventional configuration, whereupon an amount of leak current is increased. As a result, a writing speed is reduced and the applied voltage cannot be raised to a desired threshold. Furthermore, electrically-charged atoms in the element isolation insulating film are diffused near to the side surfaces of the semiconductor substrate, forming fixed charge. As a result, the threshold voltage of the memory cell transistors varies.

BRIEF SUMMARY OF THE INVENTION

According to one aspect of the present invention, there is provided a nonvolatile semiconductor memory device comprising a semiconductor substrate having a plurality of active regions separately formed by a plurality of trenches formed in a surface of the semiconductor substrate at predetermined intervals, a first gate insulating film formed on an upper surface of the semiconductor substrate corresponding to each active region, a gate electrode of a memory cell transistor formed by depositing an electrical charge storage layer formed on an upper surface of the gate insulating film, a second gate insulating film and a control gate insulating film sequentially, an element isolation insulating film buried in each trench and formed from a coating type oxide film, and an insulating film formed inside each trench on a boundary between the semiconductor substrate and the element isolation insulating film, the insulating film containing nontransition metal atoms and having a film thickness not more than 5 Å.

According to another aspect of the present invention, there is provided a method of fabricating a nonvolatile semiconductor memory device, comprising forming a first gate insulating film on a semiconductor substrate, forming a first conductive layer on the first gate insulating film, etching the first conductive layer, the first gate insulating film and the semiconductor substrate, thereby forming a plurality of trenches at predetermined intervals, forming an insulating film on an inner wall surface of each trench, the insulating film containing nontransition metal atoms and having a film thickness not more than 5 Å, burying an element isolation insulating film in each trench formed with the insulating film, the element isolation insulating film being formed from a coating type oxide film, forming a second gate insulating film and a second conductive layer on the first conductive layer and an upper surface of the element isolation insulating film, and dividing the second conductive layer, the second gate insulating film and the first conductive layer, thereby forming gate electrodes.

BRIEF DESCRIPTION OF THE DRAWINGS

In the accompanying drawings:

FIGS. 6A and 6B are schematic sectional views of portions at a third stage of fabricating process, the portions corresponding to FIGS. 3A and 3B, respectively;

FIGS. 8A and 8B are schematic sectional views of portions at a fifth stage of fabricating process, the portions corresponding to FIGS. 3A and 3B, respectively;

FIG. 13 is a graph showing a leak current characteristic of the insulating film relative to electrical field intensity, the leak current being measured by a metal-insulator-semiconductor (MIS) capacitor;

FIG. 14 is a graph showing a leak current characteristic of an alumina film as insulating film relative to a film thickness during application of high electrical field;

DETAILED DESCRIPTION OF THE INVENTION

Figure 1:
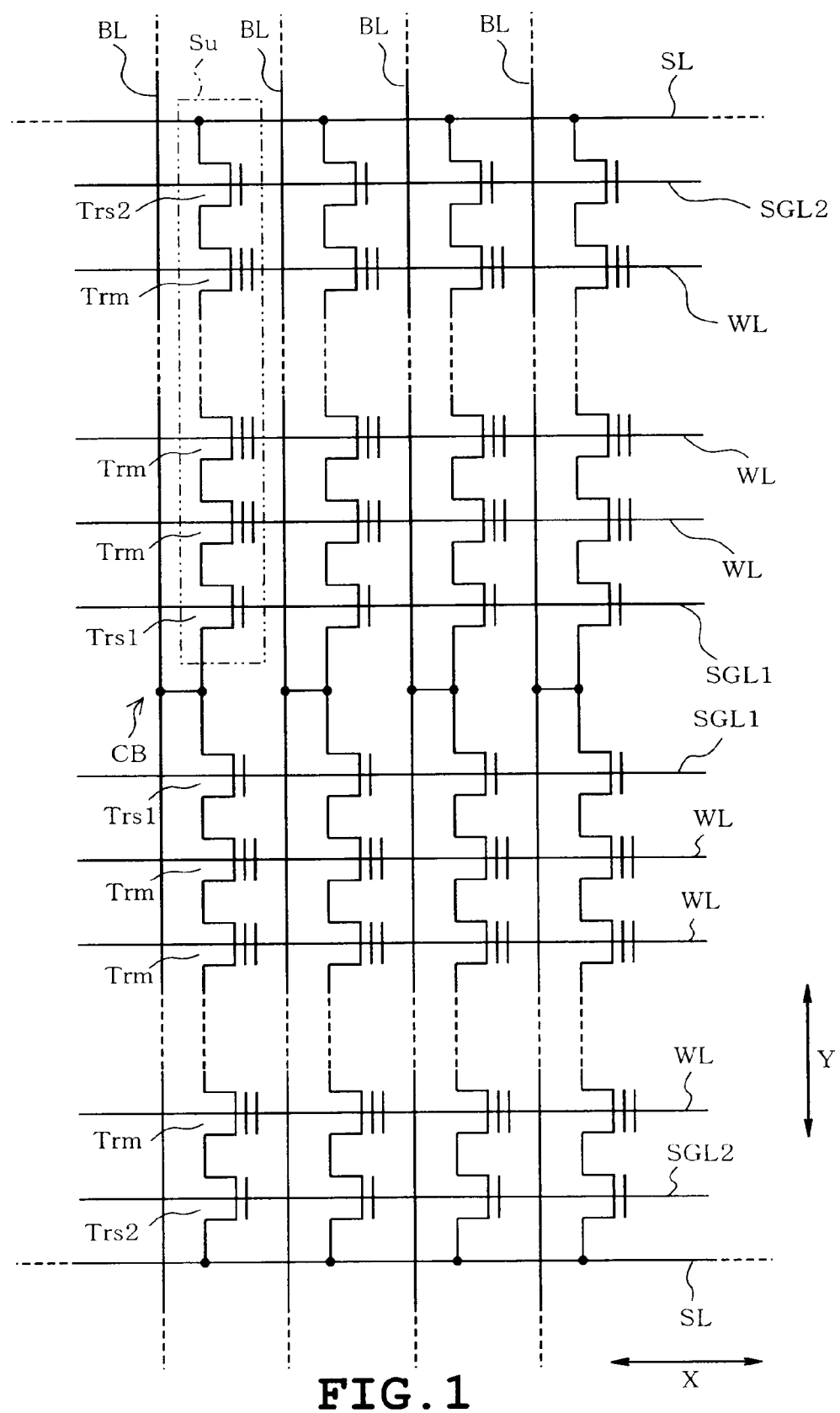
FIG. 1 is an equivalent circuit schematic showing a part of memory cell array of a NAND flash memory of one embodiment in accordance with the present invention.

One embodiment of the present invention will be described with reference to the accompanying drawings. The invention is applied to a NAND flash memory in the embodiment. In the following description, identical or similar parts are labeled by the same reference numerals. The drawings typically illustrate the invention, and the relationship between a thickness and plane dimension, layer thickness ratio and the like differ from respective natural dimensions.

Firstly, the configuration of the NAND flash memory of the embodiment will be described with reference to FIGS. 1 to 3B. The NAND flash memory has a memory cell array including a number of NAND cell units (memory units) Su arranged into a matrix as shown in FIG. 1. Each NAND cell unit includes two selective gate transistors Trs1 and Trs2 and a plurality of, for example, 16 or 32, memory cell transistors Trm series-connected between the selective gate transistors Trs1 and Trs2. In each NAND cell unit Su, each source/drain region is shared by the memory cell transistors Trm adjacent to each other.

The memory cell transistors Trm arranged in the X direction in FIG. 1 (corresponding to a direction of word line or gate width) are connected in common to word lines WL (control gate lines). Furthermore, selective gate transistors Trs1 arranged in the X direction in FIG. 1 are connected in common to selective gate lines SGL1, whereas selective gate transistors Trs2 arranged in the X direction in FIG. 1 are connected in common to selective gate lines SGL2. Bit line contacts CB are connected to drain regions of the selective gate transistors Trs1. The bit line contacts CB are connected to bit lines BL extending in the Y direction (corresponding to a direction of gate length or bit line) perpendicular to the X direction in FIG. 1. The selective gate transistors Trs2 are connected via source regions to source lines SL extending in the X direction in FIG. 1.

Figure 2:
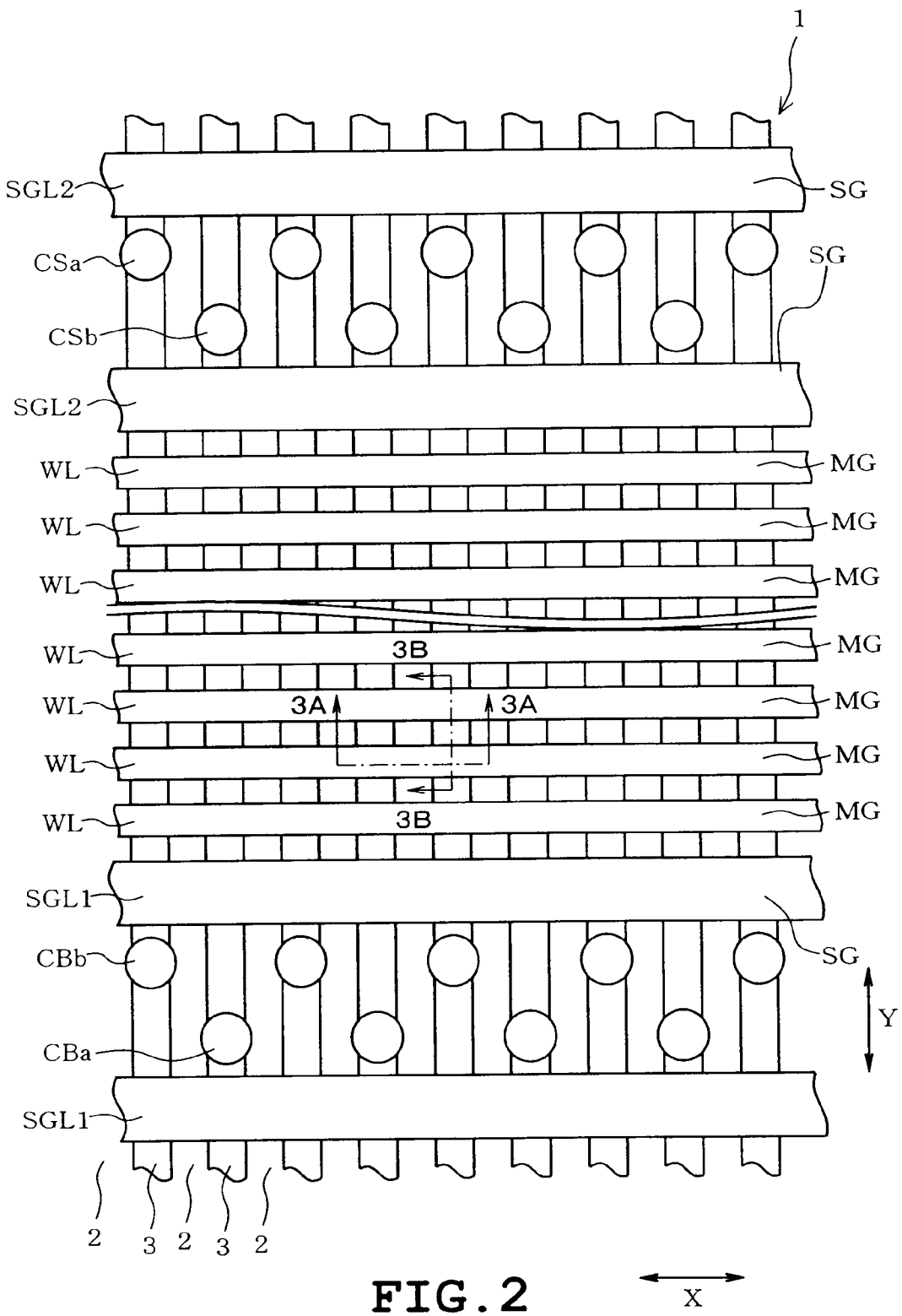
FIG. 2 is a schematic plan view showing a layout pattern of a part of memory cell region.

FIG. 2 illustrates a layout pattern of a part of the memory cell region. A plurality of trenches 2 with a shallow trench isolation (STI) structure serving as element isolation regions are formed in a silicon substrate 1 serving as a semiconductor substrate. The STI trenches 2 are formed at predetermined intervals and extend in the Y direction, whereby active regions 3 are formed so as to be separated from each other in the X direction in FIG. 2. The word lines WL of the memory cell transistors extend in the X direction perpendicular to the active regions 3 as shown in FIG. 2.

Furthermore, a pair of selective gate lines SGL1 of the selective gate transistors are formed so as to extend in the X direction in FIG. 2. Bit line contacts CBa and CBb are formed on the active regions 3 between the selective gate lines SGL1. The bit line contacts CBa and CBb are arranged alternately on the active regions 3. The bit line contacts CBa are located nearer to one of the selective gate lines SGL1, whereas the bit line contacts CBb are located nearer to the other selective gate line SGL1. Thus, the bit line contacts CBa and CBb are disposed in a zigzag alignment.

A pair of selective gate lines SGL2 of the selective gate transistors are located next to a predetermined number of word lines WL. The selective gate lines SGL2 extend in the X direction in FIG. 2. Source line contacts CSa and CSb are also disposed in a zigzag alignment on the active regions 3 between the selective gate lines SGL2. Gate electrodes MG of the memory cell transistors Trm are formed on portions of the active regions 3 intersecting the word lines WL. Gate electrodes SG of the selective gate transistors are formed on portions of the active regions 3 intersecting the selective gate lines SGL1.

Figure 3B:
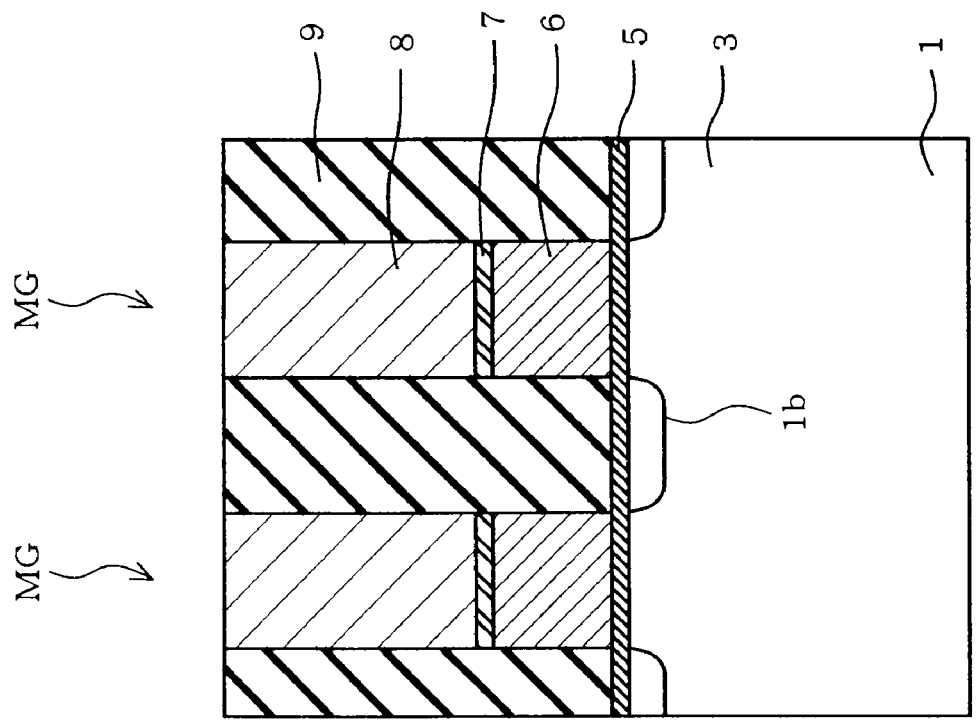
FIGS. 3A and 3B are sectional views taken along lines 3A-3A and 3B-3B in FIG. 2 respectively.
Figure 3A:
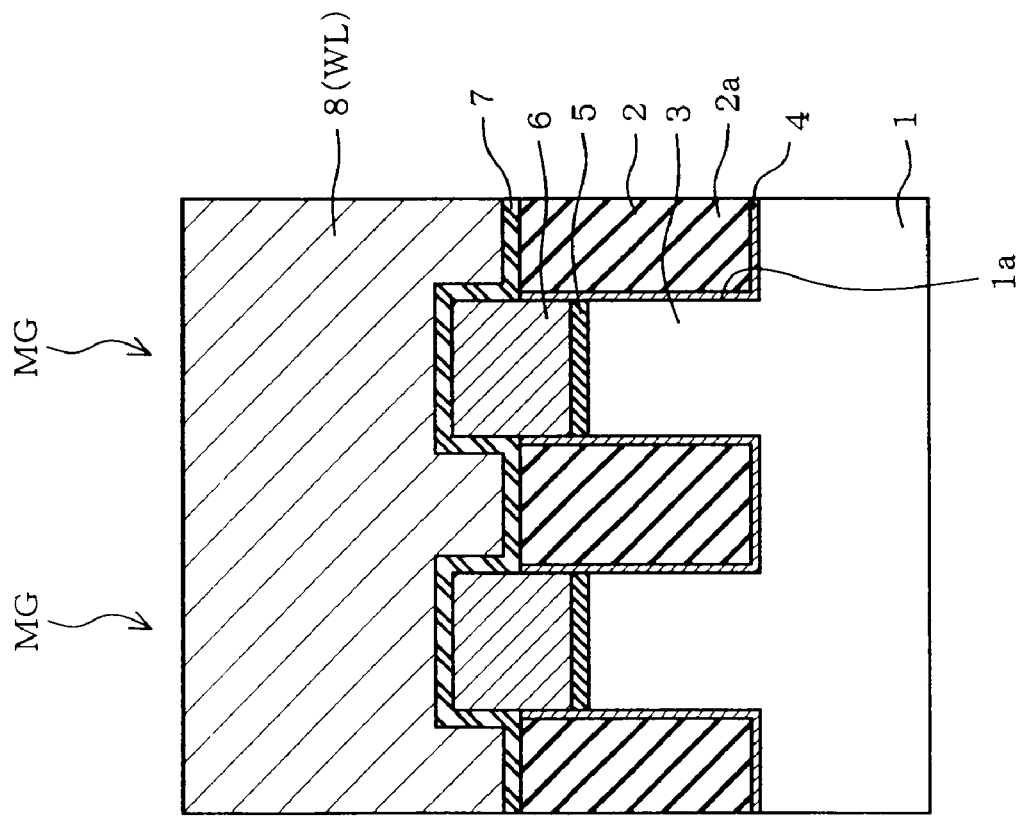

FIG. 3A is a sectional view which is taken along line 3A-3A in FIG. 2 so as to transverse the active regions 3 in the X direction. FIG. 3B is a sectional view which is taken along line 3B-3B in FIG. 2 so as to transverse the word lines WL in the Y direction. The silicon substrate 1 has a surface layer in which trenches 1a are formed at predetermined intervals. A thin insulating film 4 comprising alumina ($Al_2O_3$) is formed on both inner sidewalls and bottom of each trench 1a. The thin insulating film 4 has a film thickness set to or below 5 Å. The thin insulating film 4 is further formed so that a surface concentration of aluminum atoms contained in the thin insulating film 4 is at or above $1\times10^{12}$ atoms/cm$^2$. An element isolation insulating film 2a comprising a silicon oxide film is buried in each trench 1a with the thin insulating film 4 being placed on the sidewalls and bottom of each trench, whereupon each STI trench 2 is formed. Furthermore, the surface layer of the silicon substrate 1 is divided into active regions 3 by the STI trenches 2. A silicon oxide film may be formed between the thin insulating film 4 and the silicon substrate 1.

A first gate insulating film 5 is formed on an upper surface of the active region 3 of the silicon substrate 1. Floating gate electrodes 6 are deposited on upper surfaces of the first gate insulating film 5. Each floating gate electrode 6 serves as an electrical charge storage layer comprising a polycrystalline silicon film. The element isolation insulating films 2a and the thin insulating film 4 are formed so as to extend to a middle height of the floating gate electrode 6. A second gate insulating film 7 is deposited on the upper surface and sidewalls of each floating gate electrode 6 and the upper surface of each element isolation insulating film 2a. The second gate insulating film 7 serves as an interelectrode insulating film comprising an oxide-nitride-oxide (ONO) film. A control gate electrode 8 is deposited on an upper surface of the second gate insulating film 7. The control gate electrode 8 comprises a polycrystalline silicon film corresponding to the word lines WL. Thus, the gate electrode MG of each memory cell transistor Trm is configured as described above.

On the other hand, as shown in FIG. 3B, impurity diffusion regions 1b are formed in the active region 3 of the silicon substrate 1. Each impurity diffusion region 1b serves as a source/drain region formed in the surface layer between the gate electrodes MG. Furthermore, an interlayer insulating film 9 is buried between the gate electrodes MG.

A process of fabricating the foregoing configuration will now be described FIGS. 4A to 11B. FIGS. 4A and 4B to 11A and 11B illustrate portions of the NAND flash memory corresponding to FIGS. 3A and 3B respectively. Although portions of the memory cell transistor will be described in the following, the NAND flash memory is actually provided not only with the memory cell region but also with peripheral circuit regions each of which is provided with transistors.

Figure 4A:
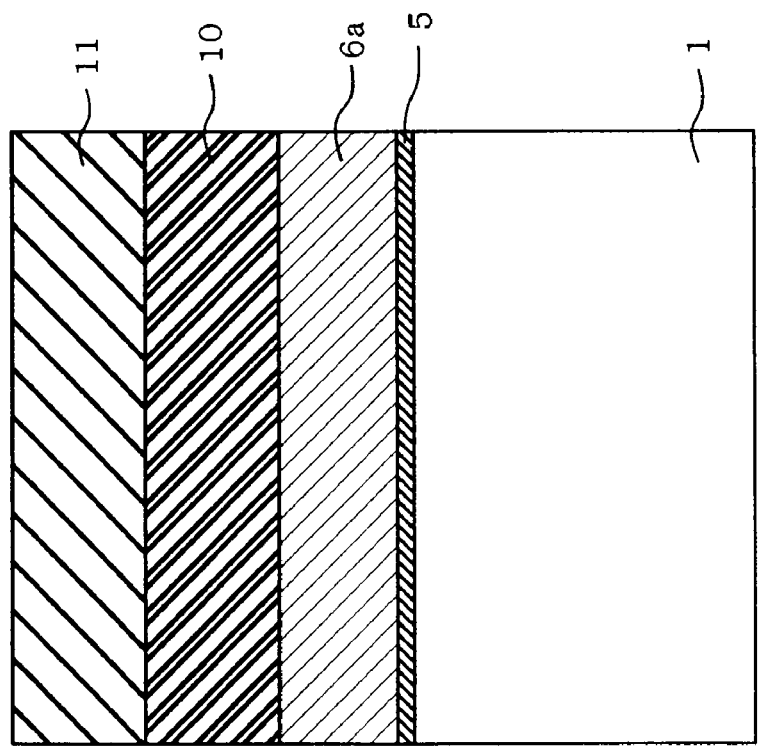
FIGS. 4A and 4B are schematic sectional views of parts at a first stage of fabricating process, the portions corresponding to FIGS. 3A and 3B, respectively.
Figure 4B:
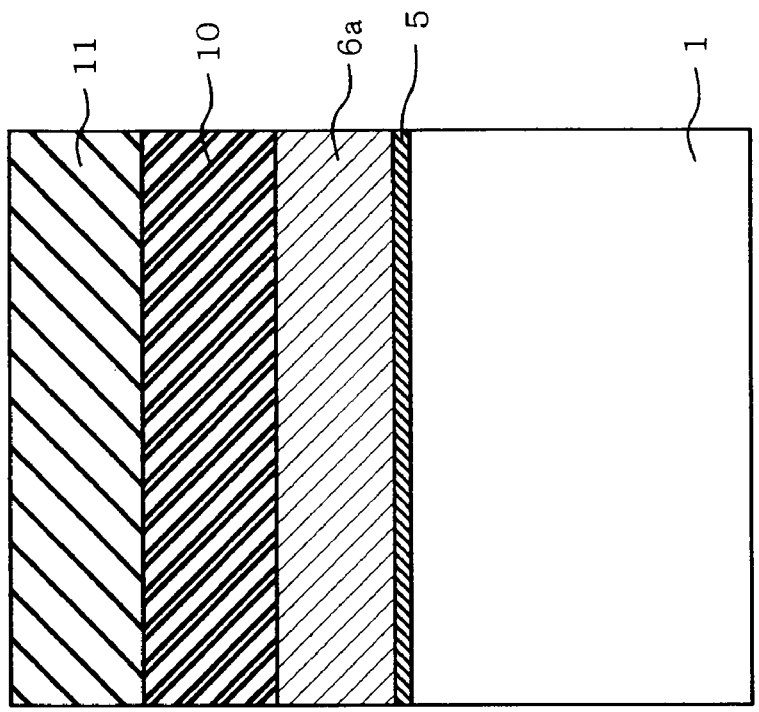

Firstly, as shown in FIGS. 4A and 4B, the first gate insulating film 5 is formed on the p-silicon substrate 1. An amorphous silicon film 6a is deposited on an upper surface of the first gate insulating film 5 by a chemical vapor deposition (CVD) method. The amorphous silicon film 6a serves as the floating gate electrode 6 which is an electrical charge storage layer. The amorphous silicon film 6a LS subsequently converted to a polycrystalline silicon film by an annealing process. A silicon nitride film 10 and a silicon oxide film 11 are deposited on the amorphous silicon film 6a in turn by the CVD method. The silicon substrate 1 may be of n-type. A p-well is formed in this case.

Figure 5B:
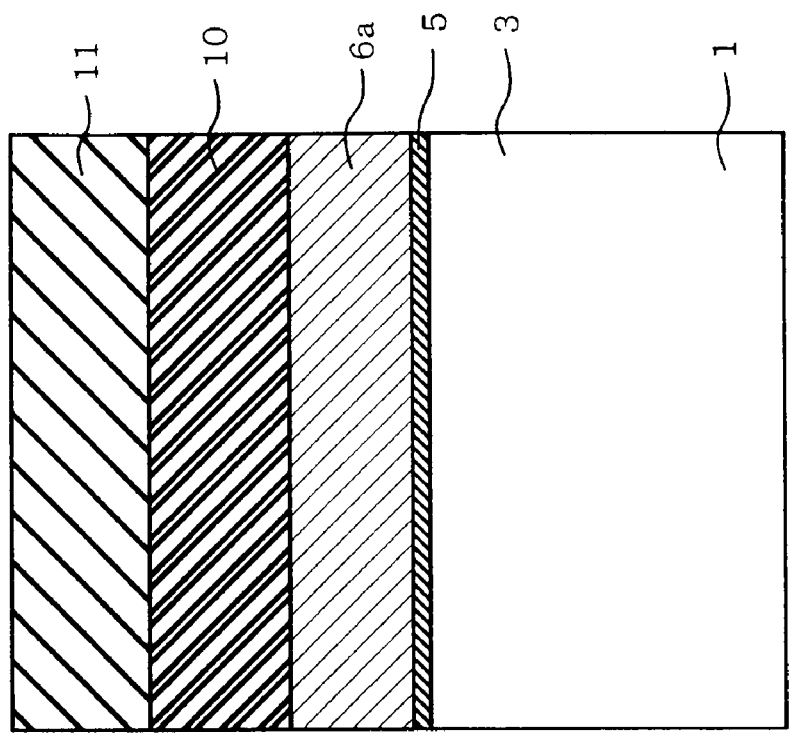
FIGS. 5A and 5B are schematic sectional views of portions at a second stage of fabricating process, the portions corresponding to FIGS. 3A and 3B, respectively.
Figure 5A:
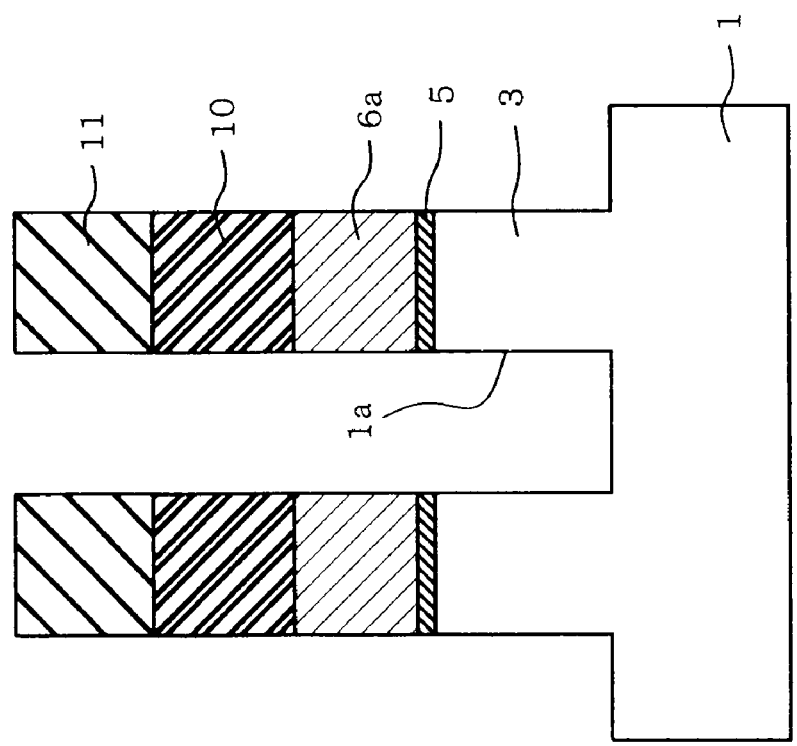

Subsequently, photoresist is patterned by the photolithography process so that a pattern corresponding to the configuration of the active regions 3 of the memory cell region is formed, as shown in FIGS. 5A and 5B. The silicon oxide film 11 is etched by the reactive ion etching (RIE) method with the resist pattern serving as a mask. Subsequently, the resist is removed and the silicon nitride film 10 is etched by the RIE method with the pattern of the etched silicon oxide film 11 serving as a mask. Furthermore, the amorphous silicon film 6a, the first gate insulating film 5 and the silicon substrate 1 are sequentially etched so that the trench 1a serving as the element isolation trench is formed.

Subsequently, the thin insulating film 4 serving as an insulating film containing metal atoms is formed on the inner wall surfaces and the bottom of the trench 1a, the side surfaces of the amorphous silicon film 6a, silicon nitride film 10 and silicon oxide film 11, and the upper surface of the silicon oxide film 11, as shown in FIG. 6A. The thin insulating film 4 contains nontransition metal atoms, for example, aluminum (Al) atoms as oxides. The aluminum oxide may be one with a fixed ratio of chemical combination with oxygen or composition, such as alumina ($Al_2O_3$). However, the aluminum oxide should not be limited to aluminum (Al) but may be an insulating film combined with oxygen or an insulating film containing aluminum atoms.

The thin insulating film 4 is formed so as to have a desired film thickness using an atomic layer deposition (ALD) method, for example. In this case, the film thickness of the thin insulating film 4 is set to or below 5 Å, and the aluminum atoms contained in the film has a surface concentration which is not less than $1\times10^{12}$ atoms/cm$^2$. Since the film thickness of the thin insulating film 4 is so small as to correspond to a film thickness of one atomic layer, the film thickness may or may not be uniform. Furthermore, the effect of reducing leak current that will be described later is deteriorated when the film thickness of the thin insulating film 4 exceeds 5 Å. Accordingly, the aforesaid range of surface concentration is preferred under the condition where the film thickness of the thin insulating film 4 is set to or below 5 Å. It is difficult to define the lower limit of the film thickness strictly. The aforesaid definition of surface concentration is thus considered to be one of proper conditions.

The nontransition metal atom includes magnesium (Mg) other than aluminum. A magnesium oxide (MgO) film can be used as the aforesaid oxide. Furthermore, the insulating film may comprise a ternary compound containing aluminum, such as a hafnium aluminate (HfAlO). Additionally, a method of forming the thin insulating film 4 should not be limited to the above-mentioned atomic layer deposition method but may include a method of introducing nontransition metal atoms into an oxide film by ion implantation, a low-pressure chemical vapor deposition (LPCVD) method, a method of chemically forming the thin film on the surface of the substrate by soaking the substrate in a solution containing nontransition metal atoms, and a method of forming the thin film by oxidation after vapor deposition of nontransition metal atoms. The thin insulating film 4 may be formed directly on the inner sidewalls and bottom of the trench 1a or formed after the forming of the silicon oxide film such as the thermally-oxidized film on the inner sidewalls and bottom of the trench 1a.

Figure 7B:
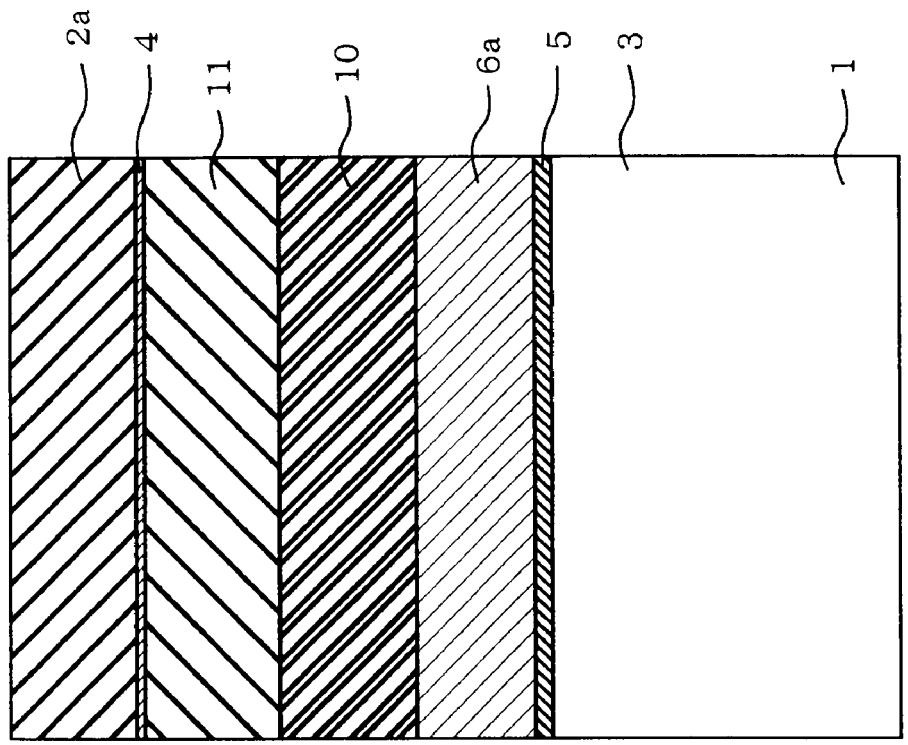
FIGS. 7A and 7B are schematic sectional views of portions at a fourth stage of fabricating process, the portions corresponding to FIGS. 3A and 3B, respectively.
Figure 7A:
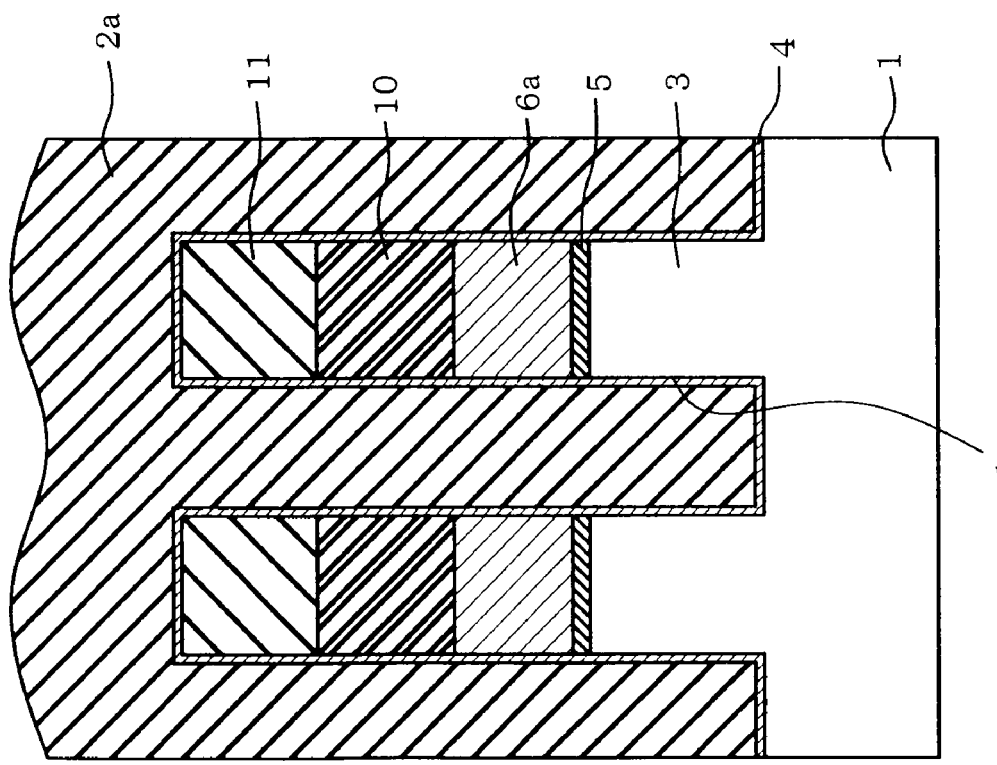

Subsequently, the coating oxide film is coated on the upper surface of the thin insulating film 4 as the element isolation insulating film 2a as shown in FIGS. 7A and 7B. The coating oxide film is buried in the trench 1a and is formed so as to reach the top of the trench 1a. A spin-on glass (SOG) film such as polysilazane (PSZ) may be used as the element isolation insulating film 2a. Thereafter, the element isolation insulating film 2a is thermally treated in the presence of oxygen or steam thereby to be high-densified.

Subsequently, the coating oxide film 2a is polished by a chemical mechanical polishing (CMP) method and planarized with the silicon nitride film 10 serving as a stopper. Subsequently, the coating oxide film 2a and the thin insulating film 4 are etched back using an etching condition including etching selectivity relative to the silicon nitride film 10, so that the upper surfaces of the coating oxide film 2a and the thin insulating film 4 are located at the middle of the floating gate electrode 6, whereby the STI trench 2 in which the element isolation insulating film 2a is buried is formed, as shown in FIGS. 8A and 8B.

Figure 9B:
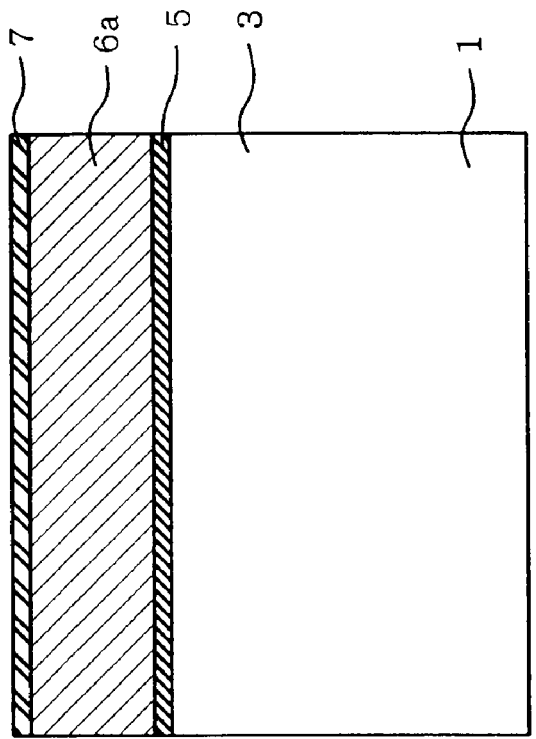
FIGS. 9A and 9B are schematic sectional views of portions at a sixth stage of fabricating process, the portions corresponding to FIGS. 3A and 3B, respectively.
Figure 9A:
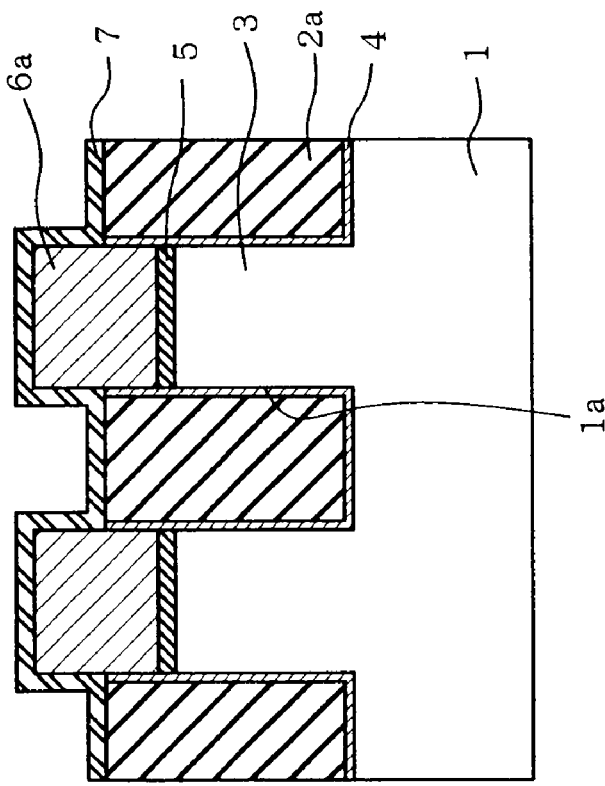

Subsequently, the silicon nitride film 10 is removed by etching so that an upper part of the polycrystalline silicon film of the floating gate electrode 6 is exposed, as shown in FIGS. 9A and 9B. The second gate insulating film 7 is formed on the upper surface and sidewalls of the electrode 6 and the upper surface of the STI trench 2. An insulating film with a high electric permitivity may be used as the second gate insulating film 7. Alternatively, the second gate insulating film 7 may comprise a film with a first stacking structure of a silicon oxide film, a high-permitivity film and a silicon oxide film or a film with a stacking structure of a silicon oxide film, a silicon nitride film and a silicon oxide film. Furthermore, the second gate insulating film 7 may comprise a film having a stacking structure including the aforesaid first stacking structure sandwiched between the silicon nitride films.

Figure 10B:
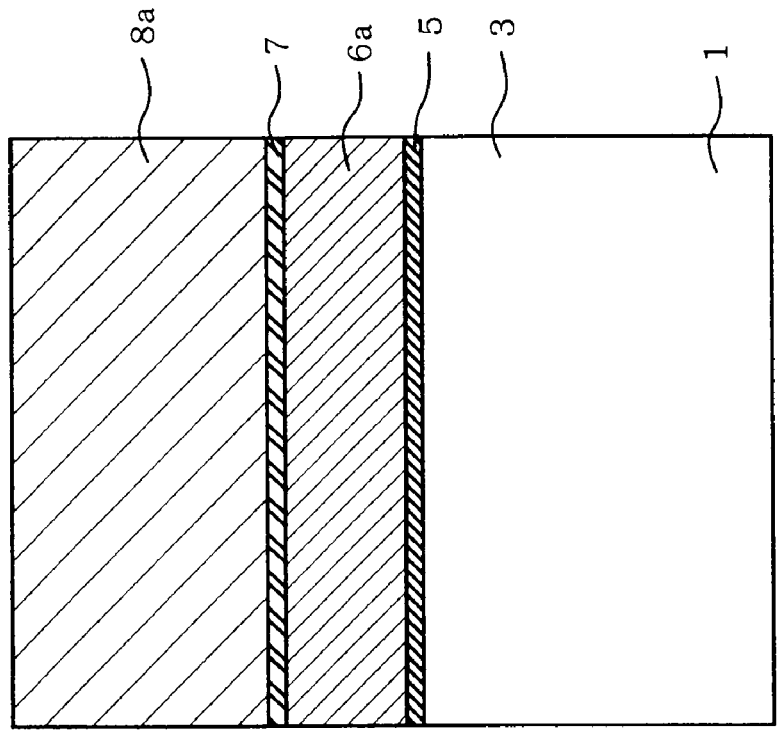
FIGS. 10A and 10B are schematic sectional views of portions at a seventh stage of fabricating process, the portions corresponding to FIGS. 3A and 3B, respectively.
Figure 10A:
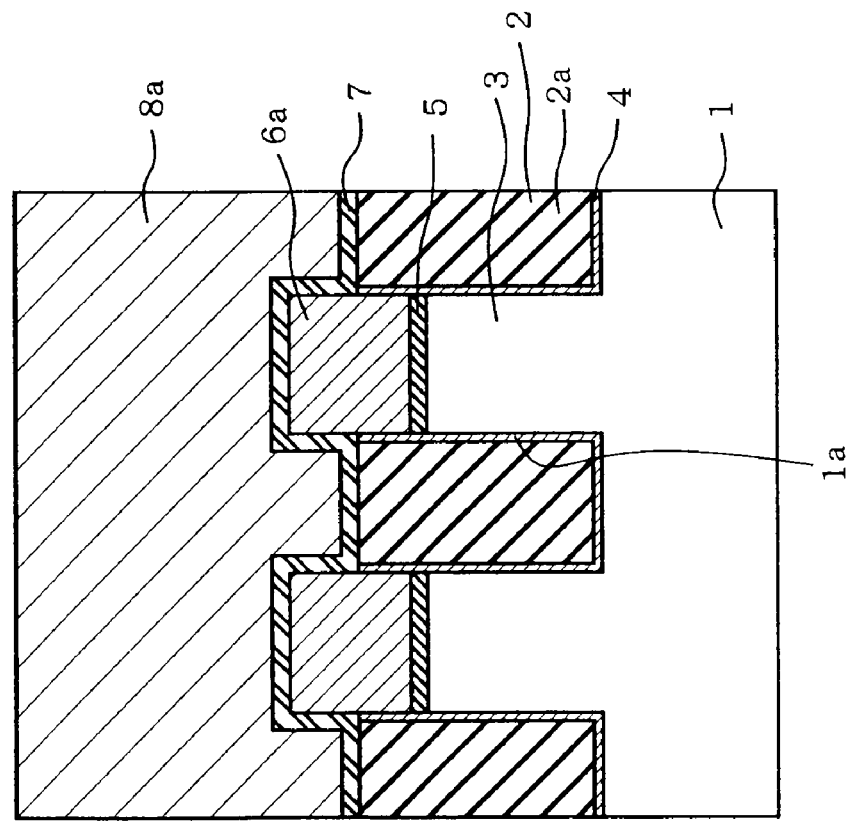
Figure 11B:
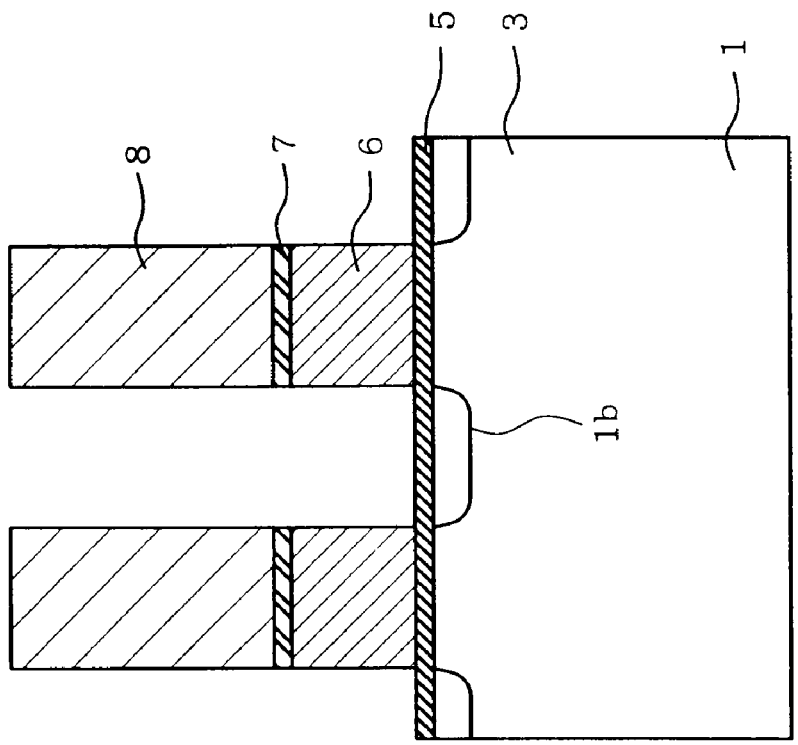
FIGS. 11A and 11B are schematic sectional views of portions at an eighth stage of fabricating process, the portions corresponding to FIGS. 3A and 3B, respectively.
Figure 11A:
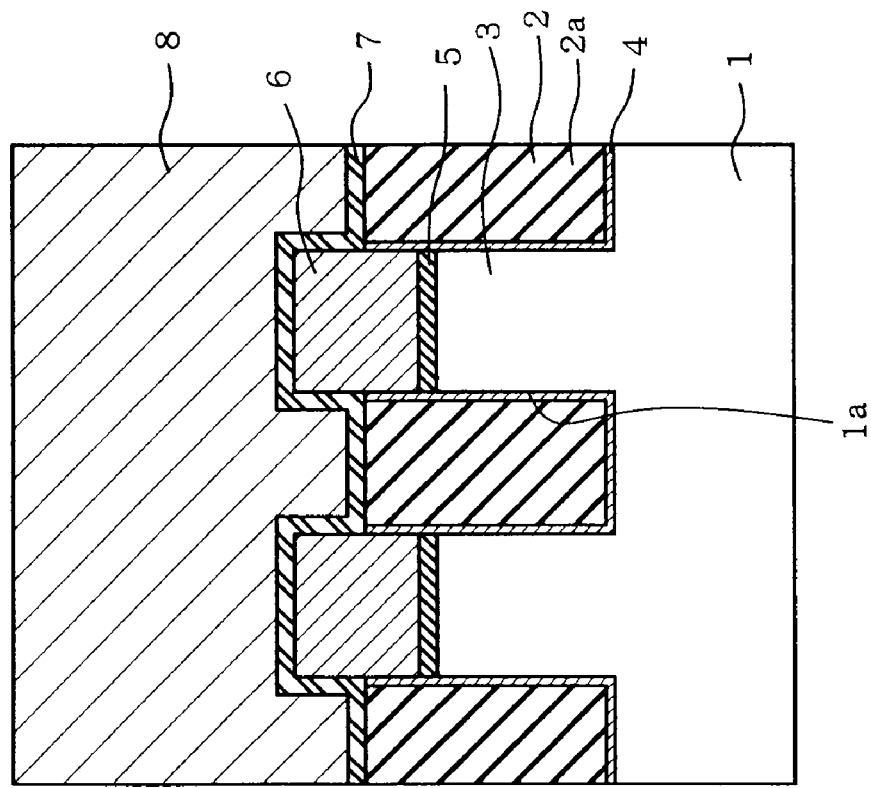

Subsequently, the amorphous silicon film 8a serving as the control gate electrode 8 is formed on the second gate insulating film 7 as shown in FIGS. 10A and 10B. The amorphous silicon film 8a is also processed by the subsequent annealing step thereby to be formed into a polycrystalline silicon film. Thereafter, another insulating film used for processing is formed on an upper surface of the amorphous silicon film 8a, and resist is patterned by the photolithography process. Subsequently, the amorphous silicon films 8a and 6a and the second gate insulating film 7 are etched by the RIE method until the first gate insulating film is exposed. As a result, the gate electrodes MG of he memory cell transistors are formed, and the control gate electrodes 8 serving as the word lines WL are formed. Thereafter, the ion implantation method is carried out so that impurities are introduced onto a part of the upper surface of silicon substrate 1, which part is located between the adjacent gate electrodes MG and belongs to the active region 3. As a result, an impurity diffusion region 1b serving as a source/drain region is formed.

Subsequently, a silicon oxide film serving as an inter-layer insulating film 9 is formed so as to fill a space between the word lines WL, whereupon the configuration as shown in FIGS. 3A and 3B is obtained. A chip is actually fabricated through a sequence of wafer fabricating process including silicification of upper parts of the control gate electrodes 8 and the forming of wiring pattern. One or more post processes are carried out so that a NAND flash memory as the nonvolatile semiconductor memory device is obtained.

According to the foregoing embodiment, each trench 1a is filled with the element isolation insulating film 2a, and the thin insulating film 4 is provided in the boundary between the element isolation insulating film 2a and each inner sidewall of the trench 1a. Consequently, an amount of leak current produced between the silicon substrate 1 and the control gate electrode 8 can be reduced during data writing. The reason for the reduction is as follows. As the distance between the silicon substrate 1 and the control gate electrode 8 is reduced, a fixed charge is generated by the influences of impurities contained in the element isolation insulating film 2a such that an amount of leak current tends to be increased. Even in this case, the dielectric constants increase and the electronic tunnel distance becomes long by the aluminum atoms contained in the thin insulating film 4.

Furthermore, the fixed charge causing malfunction of memory cell transistors can be reduced, whereby the nonvolatile semiconductor memory device with outstanding data writing characteristic and transistor operation can be realized. Furthermore, since the thin insulating film 4 containing aluminum as the nontransition metal atom is formed on the silicon substrate 1, the silicon substrate 1 can be prevented from occurrence of crystal defects by stress resulting from film contraction of an element isolation insulating film which is provided for a peripheral transistor formed in the peripheral circuit region and which has a particularly larger cubic volume.

Figure 12:
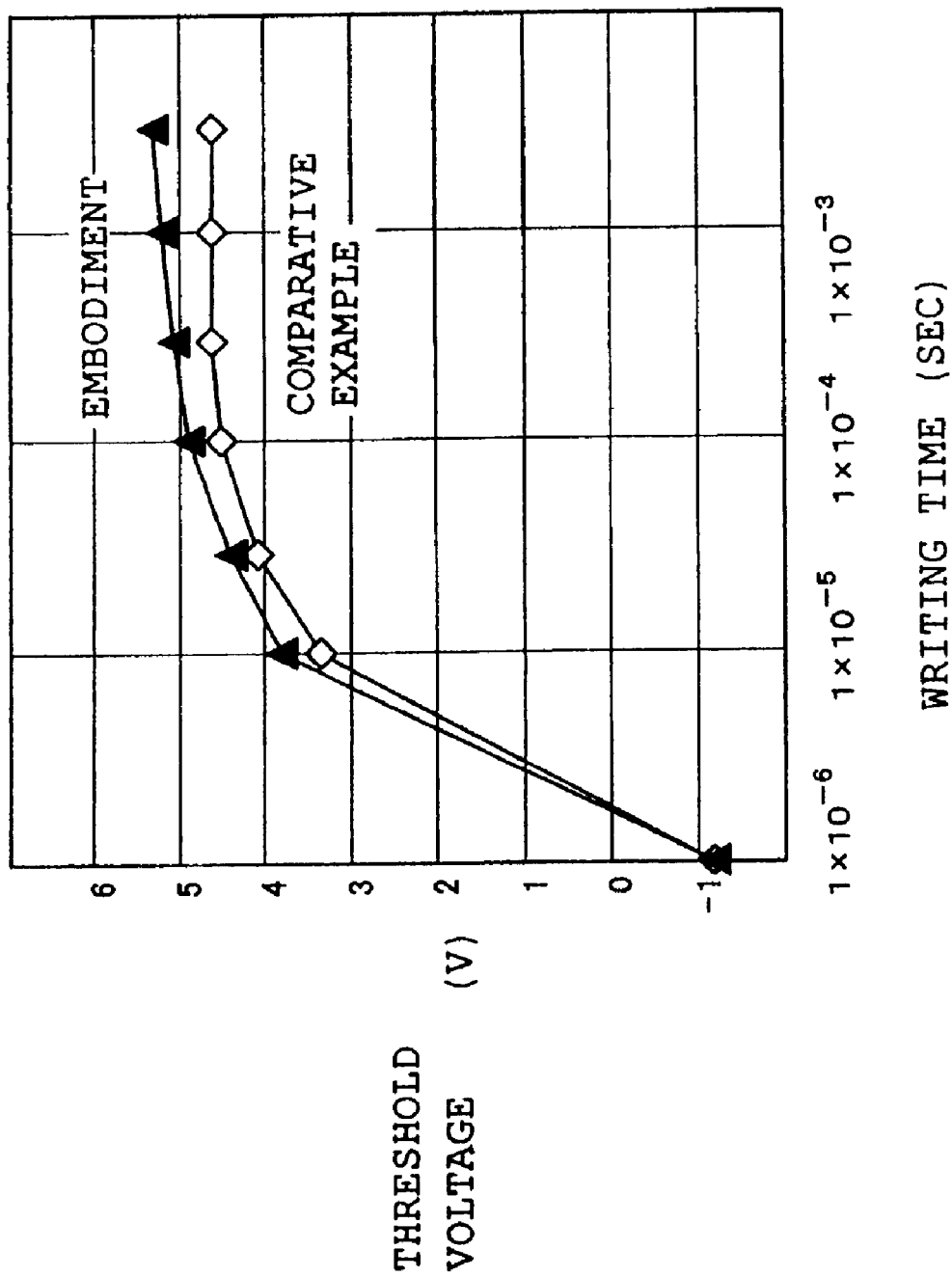
FIG. 12 is a graph showing correlated characteristics of a writing time and a threshold in the embodiment and a comparative example.

Measured data will be described for the purpose of confirming the foregoing advantages of the embodiment. FIG. 12 is a graph shows dependency of a threshold voltage of the memory cell transistor upon a writing time. FIG. 12 shows data of a comparative example which is a configuration without an thin insulating film 4 as well as data of the embodiment. It can be understood that the writing time is long and the threshold voltage tends to be saturated with increase thereof in each case. This occurs because electrons implanted from the active region 3 part of the silicon substrate 1 into the floating gate electrode 6 goes through the control gate electrode 8, that is, leak currents of the first and second gate insulating films 5 and 7 are equilibrated with each other. This further occurs because an amount of leak current of the second gate insulating film 7 is large and leak current becomes large between the silicon substrate 1 and the control gate electrode 8 with a reduction in the distance between the silicon substrate 1 and the control gate electrode 8.

In the structure of the foregoing embodiment, that is, in the structure in which the thin insulating film 4 is provided, an amount of leak current from the silicon substrate 1 to the control gate electrode 8 side can be reduced, whereby the writing speed and writing saturation threshold can be improved.

Next, FIG. 13 shows the results of measurement of leak current in the case where an alumina ($Al_2O_3$) film equivalent to the thin insulating film 4 is inserted into the silicon substrate 1 side of the used MIS capacitor. As obvious from the shown results, when compared with the comparative example in which no alumina film is provided, the configuration in which the alumina film is provided can achieve one digit or more of improvement is achieved at the high electric field side as the leak current reduction effect.

FIG. 14 shows the leak current reduction effect in the application of high electrical field in the case where the film thickness of the alumina film is changed. From the results, it can be understood that the film thickness of alumina film or thin insulating film 4 is reduced in the range of 0 to 10 Å. The reduction effect is higher in a range of the film thickness of the thin insulating film 4 from 1 to 5 Å. A further higher reduction effect can be achieved when the thin insulating film 4 has a film thickness of about 3 Å. Consequently, an amount of leak current between the silicon substrate 1 and the control gate electrode 8 can be reduced in the actual device. Furthermore, the writing speed and saturation threshold can also be increased.

The reason for selection of the nontransition metal as the metal atoms contained in the thin insulating film 4 is that an insulating film containing Al, Mg or Sr as the nontransition metal has a higher dielectric constant and a smaller trap/detrap effect than a silicon oxide film, whereby a desired effect can be achieved while the influences upon the device is rendered minimum.

Next, since the above-described thin insulating film 4 has a high dielectric constant, influences of the thin insulating film 4 with the high dielectric constant upon the device will now be examined. When the thin insulating film 4 with the high dielectric constant is applied to the element isolation insulating film 2a, an increase is predicted in the parasitic capacitance produced between the film 4 and the gate electrode MG of the memory cell transistor disposed adjacent to the film 4. An increase in the parasitic capacitance results in interference between the film 4 and the memory cell transistor adjacent to the film 4, whereupon inconvenient circumstances are presumed for the device. Accordingly, the thin insulating film 4 is desired to be rendered thinner also in this regard. In this case, when transition metal atoms are used as the contained metal atoms, a higher dielectric constant could be achieved than in the use of a nontransition metal atoms and accordingly, a leak current reducing effect could be obtained with use of a thinner film. However, a trap effect would simultaneously cause electron detrap, whereupon potential variations would occur.

Accordingly, it is effective to form an thin insulating film containing Al, Mg or Sr as the nontransition metal for the purpose of suppressing detrap of high-dielectric film. Consequently, the effect of reducing the leak current can be achieved while detrap of trapped electrons is controlled.

Figure 15:
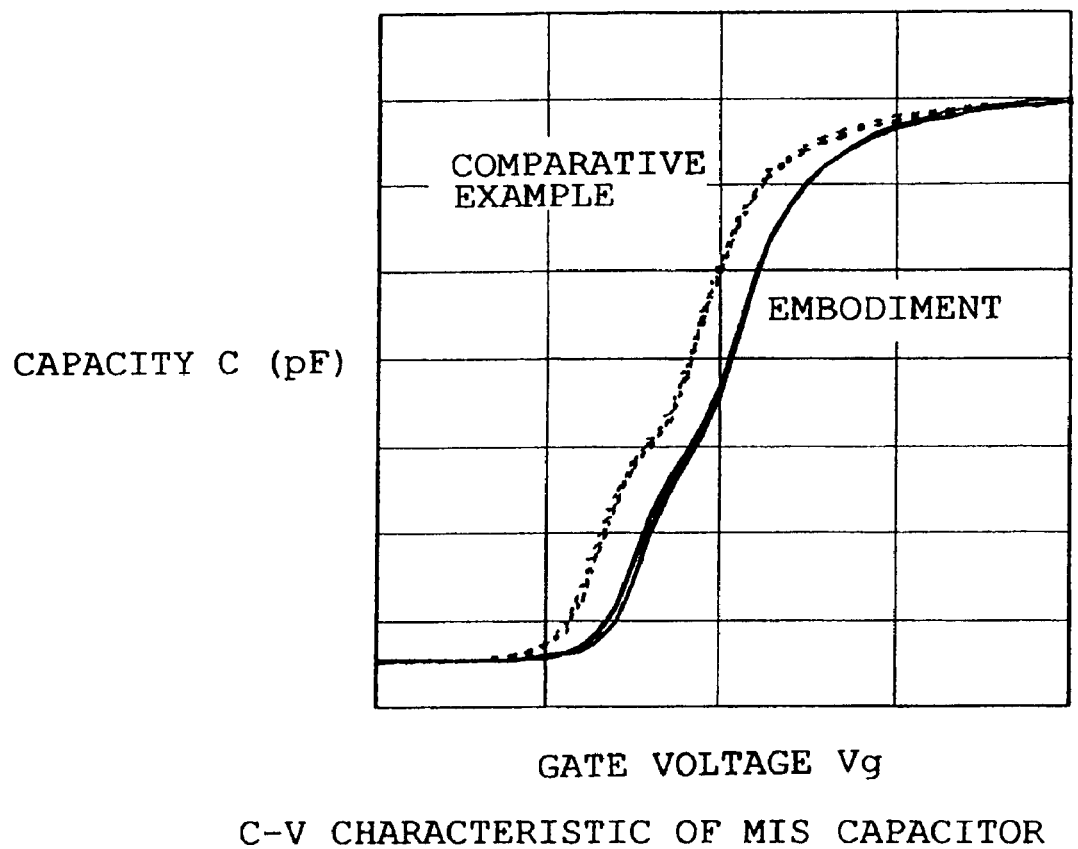
FIG. 15 is a graph showing current-voltage characteristics of the insulating film measured by the MIS capacitor.

Next, when a film containing nitride or carbon, such as polysilazane, is formed in the element isolation insulating film 2a, impurities produced in a film forming process are diffused near to the boundary opposed to the surface layer of the silicon substrate 1 through a subsequent thermal process. The impurities would sometimes form fixed charge, thereby varying the threshold voltage. In order that deterioration of the semiconductor device due to the aforesaid fixed charge may be suppressed, an alumina film is formed as the thin insulating film 4 since carbon and nitride form positive charge. The alumina film compensates for the fixed charge. The inventors conducted an experiment to confirm negative fixed charge formed in the alumina film. FIG. 15 shows experimental results or more specifically, an insulating film was formed on the semiconductor substrate. An alumina film was added to the insulating film thereby to be formed into an MIS capacitor. A capacity-voltage (C-V) characteristic was measured using the MIS capacitor. A measured curve was shifted to the positive side in the case where the alumina film was formed as compared with a comparative example in which no alumina film was formed. As a result, the inventors confirmed the negative charge formed in the alumina film.

In the foregoing embodiment, the thin insulating film 4 comprising an alumina film forming negative fixed charge is formed on the boundary between the sidewall of the trench 1a and the element isolation insulating film 2a. As a result, the element isolation insulating film 2a or the polysilazane film is accumulated on the side surfaces of the element in a thermal process thereby to neutralize the positive fixed charge. Consequently, the inventors found that variations in the transistor threshold could be reduced.

Figure 16:
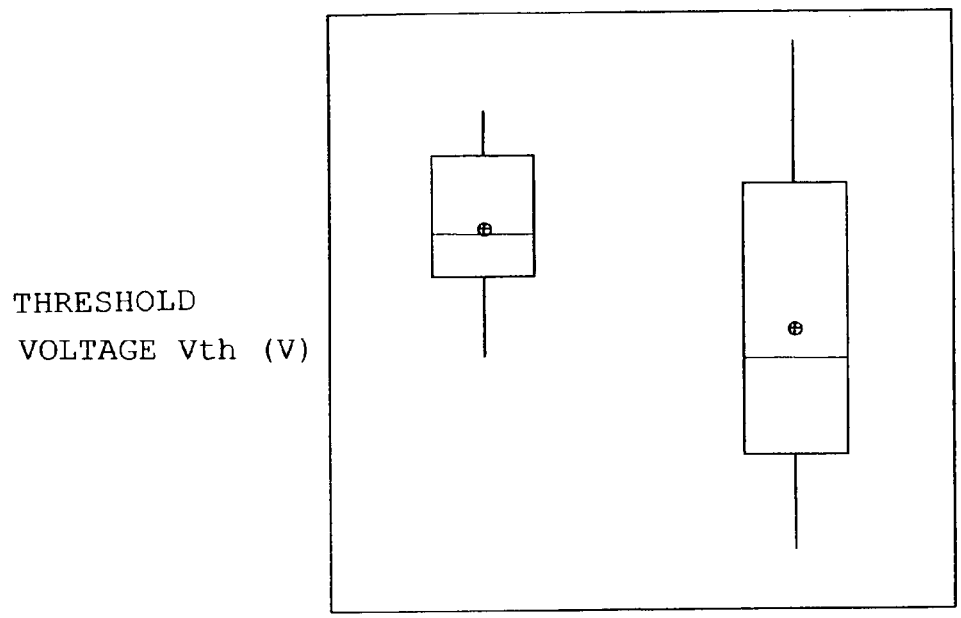
FIG. 16 shows the results of measurement of variations in threshold voltages with and without the insulating film.
Figure 17:
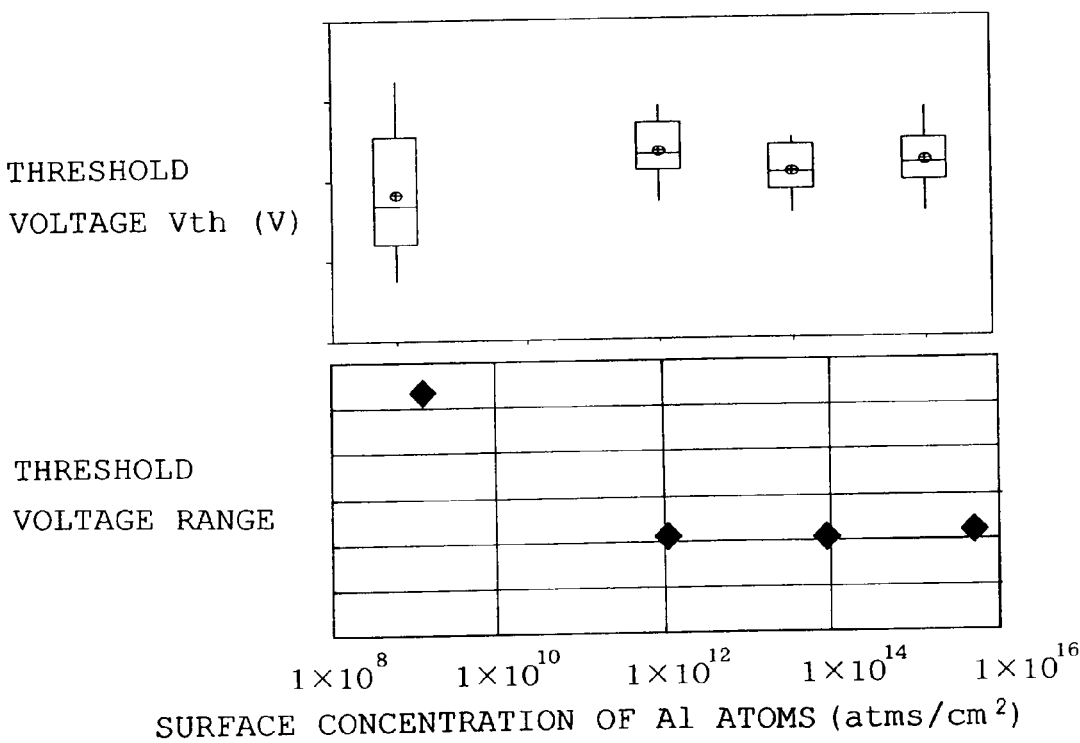
FIG. 17 is a correlation diagram showing the results of measurement of variations in threshold voltages relative to a surface concentration of aluminum atoms contained in the insulating film.

FIG. 16 shows variations in threshold voltage data both in the embodiment and in a comparative example in which no thin insulating film 4 is formed. It can be understood that variations in the threshold voltage can be reduced when the thin insulating film 4 comprising the alumina film is formed. The negative fixed charge contained in the thin insulating film 4 neutralizes the positive fixed charge accumulated at the STI 2 side, thereby reducing the variations in the threshold. In order to achieve the effect, the thin insulating film 4 necessitates having a surface concentration of aluminum atoms not less than $1 \times 10^{12}$ atoms/cm$^2$. This condition is obtained from the results of measurement of variations in threshold voltage in the case where the surface concentration of AL atoms is changed.

Furthermore, parasitic capacity tends to increase when a high-dielectric material or a high-k material is used for the forming of element sidewalls or as an intercell material. The parasitic capacity results in a reduction in the writing speed or malfunction in the write onto an adjacent cell. Accordingly, when a configuration with reduced parasitic capacity is necessitated, the thin insulating film 4 is formed only on the sidewalls of the trench 1a. Furthermore, crystal defects are caused by the breakdown voltage between the bottom of the trench 1a and the control gate electrode 8 or by the stress of the element isolation insulating film 2a buried in the trench 1a. In order that the crystal defects may be suppressed by changing the surface condition, it is preferable that the thin insulating film 4 is also formed on the bottom of the trench 1a.

The invention should not be limited to the foregoing embodiment. The embodiment may be modified as follows. The thin insulating film 4 may comprise atoms of another nontransition metal, instead of the aluminum atoms. Furthermore, a film other than one with a fixed elemental ratio, such as alumina ($Al_2O_3$), may be used as the thin insulating film containing nontransition metal atoms.

An SOG film other than polysilazane or a coating oxide film may be applied to the element isolation insulating film buried for the forming of the STI structure. A material with a good trench-filling characteristic may be used.

The thin insulating film 4 may be formed so as to remain only on the sidewalls of the trench 1a for the purpose of reduction in parasitic capacity other than when the thin insulating film 4 is formed on the entire inner wall of the trench 1a. In this case, aluminum atoms may be introduced into the silicon oxide film by ion implantation, or aluminum atoms may be introduced by anatomic layer deposition method or sputtering and thereafter be oxidized. Oxidized aluminum atoms may be left only on the sidewalls by an anisotropic etching process such as RIE method.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A nonvolatile semiconductor memory device comprising:
   a semiconductor substrate having a plurality of active regions separately formed by a plurality of trenches formed in a surface of the semiconductor substrate at predetermined intervals;
   a first gate insulating film formed on an upper surface of the semiconductor substrate corresponding to each active region;
   a gate electrode of a memory cell transistor formed by depositing an electrical charge storage layer formed on an upper surface of the gate insulating film, a second gate insulating film and a control gate insulating film sequentially;
   an element isolation insulating film buried in each trench and formed from a coating type oxide film; and
   an insulating film formed inside each trench on a boundary between the semiconductor substrate and the element isolation insulating film, the insulating film containing nontransition metal atoms and having a film thickness not more than 5 Å.

2. The nonvolatile semiconductor memory device according to claim 1, wherein the insulating film is formed so that a surface concentration of the nontransition metal atoms is not less than $1 \times 10^{12}$ atoms/cm$^2$.

3. The nonvolatile semiconductor memory device according to claim 1, wherein the insulating film contains aluminum (Al) atoms as the nontransition metal atoms.

4. The nonvolatile semiconductor memory device according to claim 3, wherein the insulating film is alumina ($Al_2O_3$).

5. The nonvolatile semiconductor memory device according to claim 1, wherein the insulating film is formed inside each trench on sidewalls of each trench on the boundary between the semiconductor substrate and the element isolation insulating film.

6. The nonvolatile semiconductor memory device according to claim 5, wherein the insulating film is formed inside each trench on a bottom of each trench on the boundary between the semiconductor substrate and the element isolation insulating film.

7. A method of fabricating a nonvolatile semiconductor memory device, comprising:

forming a first gate insulating film on a semiconductor substrate;

forming a first conductive layer on the first gate insulating film;

etching the first conductive layer, the first gate insulating film and the semiconductor substrate, thereby forming a plurality of trenches at predetermined intervals;

forming an insulating film on an inner wall surface of each trench, the insulating film containing nontransition metal atoms and having a film thickness not more than 5 Å;

burying an element isolation insulating film in each trench formed with the insulating film, the element isolation insulating film being formed from a coating type oxide film;

forming a second gate insulating film and a second conductive layer on the first conductive layer and an upper surface of the element isolation insulating film; and dividing the second conductive layer, the second gate insulating film and the first conductive layer, thereby forming gate electrodes.

8. The method according to claim 7, wherein in the insulating film forming step, an alumina ($Al_2O_3$) film is formed so that a surface concentration of the nontransition metal atoms is not less than $1 \times 10^{12}$ atoms/cm$^2$ and the alumina film has a film thickness not more than 5 Å.

9. The method according to claim 7, wherein the insulating film is formed on sidewalls of each trench inside each trench in the insulating film forming step.

10. The method according to claim 9, wherein the insulating film is formed on a bottom of each trench inside each trench in the insulating film forming step.

11. The method according to claim 7, wherein the insulating film is formed by an atomic layer deposition method in the insulating film forming step.

* * * * *